United States Patent
Matsuoka et al.

(10) Patent No.: US 6,248,645 B1
(45) Date of Patent: Jun. 19, 2001

(54) SEMICONDUCTOR DEVICE HAVING BURIED-TYPE ELEMENT ISOLATION STRUCTURE AND METHOD OF MANUFACTURING THE SAME

(75) Inventors: Fumitomo Matsuoka, Kawasaki; Kunihiro Kasai, Yokohama, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/320,551

(22) Filed: May 27, 1999

(30) Foreign Application Priority Data

May 28, 1998 (JP) ................................. 10-147739

(51) Int. Cl.[7] ................................................ H01L 21/76
(52) U.S. Cl. .................... 438/424; 438/434; 438/199; 438/241; 438/235; 438/238
(58) Field of Search .................... 438/199, 241, 438/235, 238, 424, 434

(56) References Cited

U.S. PATENT DOCUMENTS

| | | | |
|---|---|---|---|
| 5,633,781 | * 5/1997 | Saenger et al. | 361/321.4 |
| 5,913,132 | * 6/1999 | Tsai | 438/434 |
| 5,989,978 | * 11/1999 | Peidous | 438/436 |
| 6,066,520 | * 5/2000 | Suzuki | 438/202 |
| 6,074,930 | * 6/2000 | Cho et al. | 438/424 |

FOREIGN PATENT DOCUMENTS 4-79348   3/1992  (JP).

* cited by examiner

Primary Examiner—Matthew Smith
Assistant Examiner—V. Yevsikov
(74) Attorney, Agent, or Firm—Banner & Witcoff, Ltd.

(57) ABSTRACT

The present invention is a semiconductor device having an element isolation structure of STI, in which after the formation of the STI trench, a silicon nitride film is left over only on the side wall portion of the trench, to form a side wall. Further, ions are implanted from the bottom surface of the trench on which the side wall is formed, and thus a high-concentration punch-through suppression region having the same conductivity as that of the substrate (or well) and a concentration higher that the impurity concentration of the other section close to the substrate (or well), is formed selectively only in the section of the substrate (or well) which is near the bottom surface of the trench. In this manner, the punch-through suppression region can be formed only in the bottom portion of the STI in a self-alignment manner by the thickness of the side wall. With this structure, even if the STI has a shallow or fine element isolation structures the punch-through between diffusion layers can be suppressed, and the occurrence of a junction leak between the high-concentration diffusion layer region and the well can be prevented. Therefore, a well structure of a low capacitance, which is suitable for a high-speed operation device, can be designed.

11 Claims, 5 Drawing Sheets

SEMICONDUCTOR DEVICE HAVING BURIED-TYPE ELEMENT ISOLATION STRUCTURE AND METHOD OF MANUFACTURING THE SAME

BACKGROUND OF THE INVENTION

The present invention relates to a semiconductor device having a buried-type element isolation structure, and a method of manufacturing such a semiconductor device, and more specifically, to a semiconductor device in which elements are isolated by STI (shallow trench isolation) and a method of manufacturing such a device.

As is known, semiconductor devices having a buried-type element isolation structure entail the advantages of decreasing the size of element isolation regions, and achieving a well structure capable of suppressing the capacitance of the diffusion layer and being suitable for high-speed operation device.

For example, in order to maintain the capacitance of the diffusion layer at low, it suffices only if the concentration of impurities in the portion of the substrate, which corresponds to the bottom surface of the diffusion layer, or the concentration in the well is set to be sufficiently low. However, when the well concentration is lowered excessively, punching through between diffusion layers becomes uncontrollable. In order to avoid this, the concentration in the portion of the substrate, which corresponds to the bottom surface of the buried element isolation structure, or the well concentration is selectively increased, and thus the reduction of the capacitance of the diffusion layer and the control of the punch-through between diffusion layers are achieved at the same time in conventional techniques.

However, as the semiconductor devices are downsized, the trench for the element isolation becomes shallower (which is so-called STI). Therefore, even with the method described above, it is becoming difficult to achieve the reduction of the capacitance of the diffusion layer and the control of the punch-through for the element isolation, at the same time.

The conventional technique mentioned above will now be briefly reviewed with reference to FIGS. 1A to 1D, which are cross sections illustrating a manufacturing step for manufacturing the conventional buried-type element isolation structure and drawback of such a conventional technique.

First, as shown in FIG. 1A, conventionally, a silicon oxide film 2 is formed to have a thickness of about 10 nm, on a semiconductor (silicon (Si)) substrate 1 by a thermal oxidation method or the like. Then, a silicon nitride film 3 is deposited to have a thickness of about 200 nm, on the silicon oxide film 2 by a chemical vapor growth method or the like. Further, thus resultant structure is treated in the following manner. That is, the silicon nitride film 3, the silicon oxide film 2 and the silicon substrate 1 are subjected to anisotropic etching one after another by a photo-etching method. Thus, a buried type element isolation trench 4 having a predetermined shape is made. After that, heat oxidation is carried out, and consequently, a silicon oxide film 5 having a thickness of, for example, about 15 nm is formed on the inner wall of the buried element isolation trench 4.

Next, as shown in FIG. 1B, for example, boron ions are implanted to the above-described structure at an acceleration voltage of 20 keV and a concentration of $1 \times 10^{13}$ cm$^{-2}$ in the case where the substrate (or well) 1 in the region where the buried element isolation trench 4 is formed is p-type. Or, for example, phosphor ions are implanted to the above-described structure at an acceleration voltage of 30 keV and a concentration of $1 \times 10^{13}$ cm$^{-2}$ in the case where the substrate (or well) 1 in the region where the buried element isolation trench 4 is formed is n-type. Thus, in a region of the substrate (or well) 1, which corresponds to the bottom portion of the buried element isolation trench 4, a punch-through suppression region 6 having the same conductivity type as that of the substrate (or well) of the region and having an impurity concentration higher than that of other substrate (or well) 1 located close thereto, is formed.

Further, to the structure shown in FIG. 1B, an insulating film 7 such as silicon oxide film is buried, and then the insulating film 7 is flattened by a CMP (chemical mechanical polish) method, or a resist etch back method or the like. Subsequently, the insulating film 7, the silicon nitride film 3 and the silicon oxide film 2 are removed except for the matter inside the buried element isolation trench 4, thus completing a buried type element isolation structure 7' as shown in FIG. 1C.

Next, as shown in FIG. 1C, for example, arsenic ions are implanted to the above-described structure at an acceleration voltage of 40 keV and a concentration of $3 \times 10^{15}$ cm$^{-2}$ in the case where the substrate (or well) 1 in the region where the element isolation structure 7' is formed is p-type. Or, for example, BF$_2$ ions are implanted to the above-described structure at an acceleration voltage of 30 keV and a concentration of $3 \times 10^{15}$ cm$^{-2}$ in the case where the substrate (or well) 1 in the region where the element isolation structure 7' is formed is n-type. Thus, a high-concentration diffusion layer region 8 is formed in a vicinity of the surface portion of the substrate (or well) 1.

After that, as shown in FIG. 1D, an interlayer insulating film 10 is deposited on the high-concentration diffusion layer region 8 and the element isolation structure 7', and a contact 11 designed to make an electrical contact with the high-concentration diffusion layer region 8 is formed in the interlayer insulating film 10. Further, a metal wiring 12 which is connected to the contact 11 is formed on the interlayer insulating film 10.

However, the element isolation structure 7' thus formed entails the following drawbacks.

That is, it is originally preferable that the high-concentration diffusion layer region 8 shown in FIG. 1C should be in contact with a substrate (or well) 1 of a lowest possible concentration, in order to keep the capacitance of the bottom surface at low. However, in the manufacturing step described above, the high-concentration diffusion layer region 8 and the punch-through suppression region 6 are brought into contact with each other in a region 9 located close to the element isolation structure 7'. Therefore, in the close region 9, the reduction of the capacitance cannot be realized, which is not preferable to increase the high-speed operation of the semiconductor device.

Further, as counter-measurements, there is a method of implanting ion only to the substrate (or well) 1, which corresponds to the bottom portion of the element isolation structure 7', in order to suppress the punch-through. However, even in the method, impurities diffuse in the substrate (or well) 1 in the lateral direction. For this reason, in devices of the future, which have shallower element isolation structure 7', it becomes difficult to reduce the capacitance of the diffusion layer.

More specifically, as the semiconductor device is downsized, the possibility where the punch-through suppression region 6 and the high-concentration diffusion layer region 8 are in contact with each other becomes higher. This is because although the high-concentration diffusion layer region 8 becomes thinner, the size of the punch-through suppression region 6 is not always reduced, in order to maintain the concentration of the impurities in the punch-through suppression region 6, which accords with the downsizing. Therefore, the high-concentration diffusion layer region 8 and the high-concentration punch-through suppression region 6 can be easily brought in contact with each other, and it becomes further difficult to form a low-capacitance diffusion layer.

Further, as can be seen in FIG. 1D, as the downsizing proceeds, the distance between the contact 11 used to obtain electrical contact with the high-concentration diffusion layer region 8, and the element isolation structure 7' becomes shorter.

Therefore, when a mask alignment error occurs during the photo-etching process, the contact 11 is overlaid upon the element isolation structure 7'.

When the above-described problem occurs, the overlying section 7a of the element isolation structure 7' is etched when the contact hole for the contact 11 is made, and thus a junction leak is created between the high-concentration diffusion layer region 8 and the well.

BRIEF SUMMARY OF THE INVENTION

The object of the invention is to provide a semiconductor device capable of a high performance, in which the capacitance of the high-concentration diffusion layer region can be suppressed at low even for a shallow or fine element isolation structure, and the occurrence of a junction leak between the high-concentration diffusion layer region and the well is prevented, and a method of manufacturing such a semiconductor device.

In order to achieve the above-described object of the present invention, there is provided a semiconductor device having a buried-type element isolation structure, comprising: a substrate or well region, of a first conductivity type; a buried element isolation trench formed in the substrate or well region of the first conductivity type; a high-concentration impurity region of the first conductivity type, formed in a section of the substrate or well region of the first conductivity type, which is located near a bottom surface of the buried-type element isolation trench; an element isolation structure portion formed within the buried-type element isolation trench; a diffusion layer region of a second conductivity, formed in a surface portion of the substrate or well region of the first conductivity type, except for a region where the element isolation structure portion is formed; an interlayer film deposited on the substrate or well region of the first conductivity type; and a contact section pierced through the interlayer film, to be connected to the diffusion layer region; wherein the element isolation structure portion is formed by burying an insulating film having an etching selectivity ratio to the interlayer film, in at least a side wall portion of the buried element isolation trench, the high-concentration impurity region is formed selectively lower than the bottom surface of the buried element isolation trench, at a predetermined distance from an end portion of the bottom surface of the buried element isolation trench, and the contact section is formed to extend over the diffusion layer region and the element isolation structure portion.

According to the present invention, there is further provided a method of manufacturing a semiconductor device having a buried-type element isolation structure, including: a substrate or well region, of a first conductivity type; a buried element isolation trench formed in the substrate or well region of the first conductivity type; a high-concentration impurity region of the first conductivity type, formed in a section of the substrate or well region of the first conductivity type, which is located near a bottom surface of the buried-type element isolation trench; an element isolation structure portion formed within the buried-type element isolation trench; a diffusion layer region of a second conductivity, formed in a surface portion of the substrate or well region of the first conductivity type, except for a region where the element isolation structure portion is formed; an interlayer film deposited on the substrate or well region of the first conductivity type; and a contact section pierced through the interlayer film, to be connected to the diffusion layer region; wherein, after an insulating film having an etching selectivity ratio to the interlayer film is formed in at least a side wall portion of the buried element isolation trench, impurities are introduced, so as to form the high-concentration impurity region at an inner side from an end portion of the bottom surface of the buried element isolation trench by a distance determined by a thickness of the insulating layer, and the contact section is formed to extend over the diffusion layer region and the element isolation structure portion.

According to the present invention, there is still further provided a method of manufacturing a semiconductor device, comprising: the first step of forming an oxide film on a substrate or well region, of a first conductivity type; the second step of forming a mask film to make a buried element isolation trench, on the oxide film; the third step of making a buried element isolation trench by processing the mask film, the oxide film and the substrate or well region, with anisotropic etching; the fourth step of forming an insulating film along an inner surface of the buried element isolation trench; the fifth step of forming a high-concentration impurity region of the first conductivity type, formed selectively in a section of the substrate or well region of the first conductivity type, which is located near a bottom surface of the buried-type element isolation trench; the sixth step of forming an element isolation structure portion by burying a filler member in the buried-type element isolation trench; the seventh step of forming a diffusion layer region of a second conductivity, in a surface portion of the substrate or well region of the first conductivity type, except for a region where the element isolation structure portion is formed; the eighth step of depositing an interlayer film having an etching selectivity ratio to the insulating film, on an entire surface; and the ninth step of making a contact section pierced through the interlayer film, to be connected to the diffusion layer region in a self-alignment manner with respect to the element isolation structure portion.

With the semiconductor device and the manufacturing method of the present invention, it becomes possible to form an ion-implanted region used for the punch-through suppression, selectively in the bottom section of the STI in a self-alignment manner. More specifically, a side wall is formed on a side surface of a trench after the formation of the trench of the STI, and the ion implantation of impurities into the structure is performed, thus forming a punch-through suppression region. In this manner, the punch-through control region is formed selectively at the bottom portion of the STI, and therefore an increase in the capacitance of the diffusion layer, which is caused by the diffusion of impurities in the lateral direction, can be suppressed.

Further, when a filler member is buried into the structure, it is filled into a front taper shape. Therefore, even if the trench itself has a rectangular shape, it is possible to bury the filler member into the trench without creating a void.

Alternatively, according to the semiconductor device and the manufacturing method, of another aspect of the present invention, a filler member is buried into a trench at a degree about equivalent to the amount of the ion implantation to the bottom portion, and impurities are ion-implanted to the bottom portion of the STI. After that, the trench is completely filled with the filler member. With this structure, it becomes possible to provide an offset in a self-alignment manner with respect to the side wall of the STI. Further, the offset serves as a buffer while the impurities implanted to the bottom portion of the STI diffuse, and thus it is possible to prevent the diffusion of the impurities to the element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described in detail with reference to accompanying drawings.

(First Embodiment)

FIGS. 2A to 2F briefly illustrate the manufacturing process for making a semiconductor device according to the first embodiment of the present invention, taking the example where the product is a logic element.

Figure 1A:
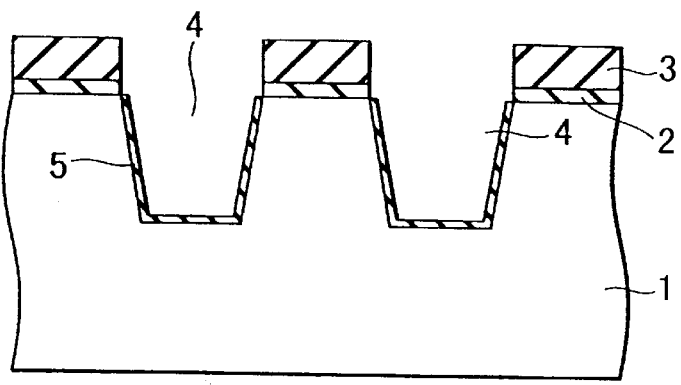
FIGS. 1A to 1D are cross sectional views illustrating steps of the manufacturing process for preparing a conventional buried element isolation structure.
Figure 1B:
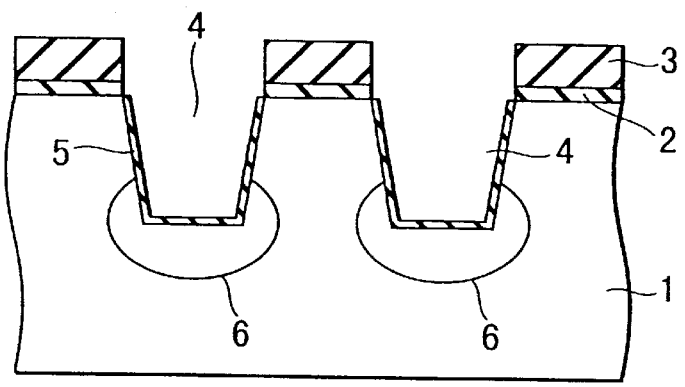
Figure 1C:
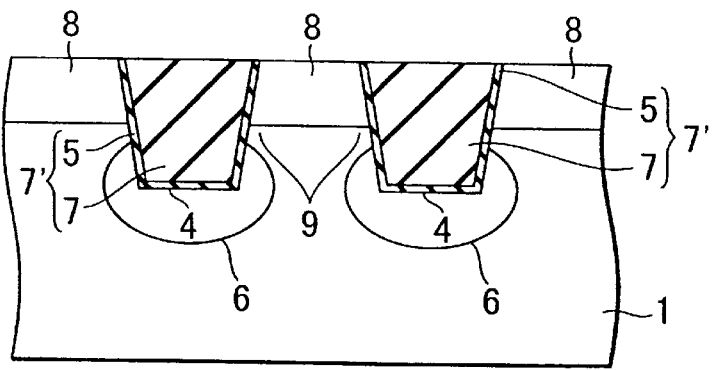
Figure 1D:
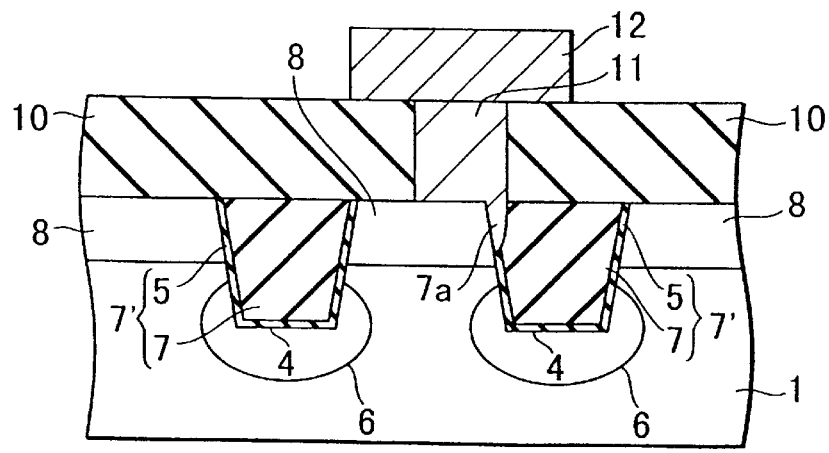
Figure 2A:
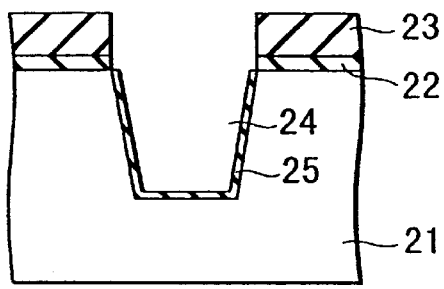
FIGS. 2A to 2F are cross sectional views illustrating steps of the manufacturing process for preparing a semiconductor device, according to the first embodiment of the present invention, taking the example where the product is a logic element.

First, as shown in FIG. 2A, a silicon oxide film 22 is formed to have a thickness of about 10 nm, on a semiconductor substrate 21 by a thermal oxidation method or the like. Then, a silicon nitride film (mask film) 23 is deposited to have a thickness of about 200 nm, on the silicon oxide film 22 by a chemical vapor growth method or the like.

With respect to the above-described structure, the silicon nitride film 23, the silicon oxide film 22 and the semiconductor substrate 21 are subjected to anisotropic etching one after another by a photo-etching method. Thus, a buried type element isolation trench 24 having a tapered shape with a predetermined angle, which is a trench used for isolating the buried type elements, is made. After that, heat oxidation is carried out, and consequently, a silicon oxide film 25 having a thickness of, for example, about 15 nm is formed on the inner wall of the buried element isolation trench 24.

Figure 2D:
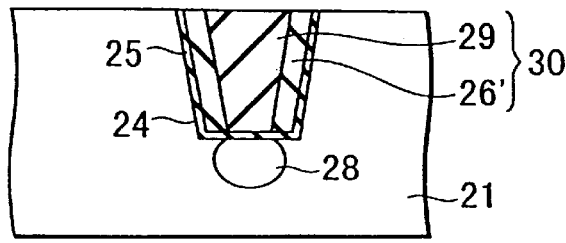
Figure 2B:
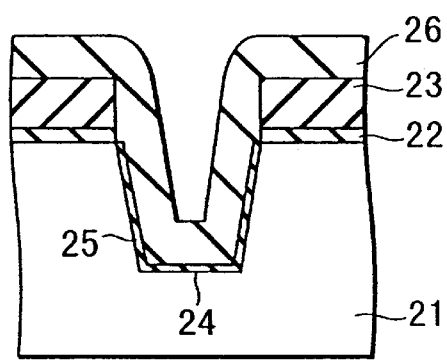
Figure 2E:
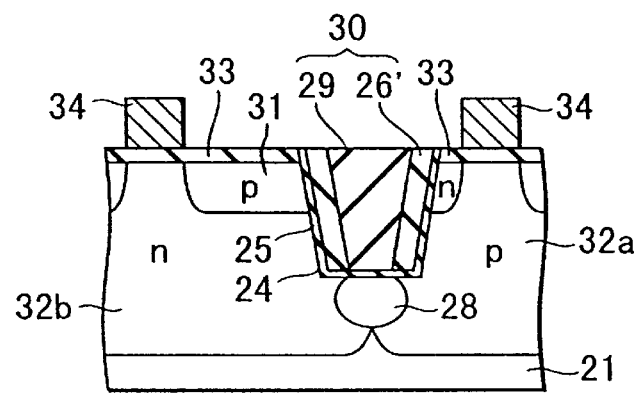

Next, with regard to the resultant structure shown in FIG. 2A, a silicon nitride film 26 is deposited to have a thickness of about 50 nm, on the silicon nitride film 23 and the silicon oxide film 25, by a chemical vapor growth method, as illustrated shown in FIG. 2B. The silicon nitride film 26 becomes to have an etching selection ratio with respect to the silicon oxide film 25 or an interlayer insulating film, when a contact hole is made in a later step.

It should be noted that the film thus used is not limited to the silicon nitride film 26; however it is necessary to use a film having an electrical insulating property for the following reason. If a conductive film made of, for example, polycrystalline silicon is used for the silicon nitride film 6, the film is set in an electrically floating state in the end, and such a state may cause the occurrence of a leak current, which is not desirable for the element isolation. Or, if a contact to be formed later is displaced and is brought in contact with the film, and another contact of an adjacent element is displaced in the diffusion layer such as to be in contact with the film, the diffusion layers of these elements adjacent to each other are electrically connected to each other via the film which extends to the inner side surface of the element isolation section, which causes a problem to the operation of the semiconductor device.

Figure 2C:
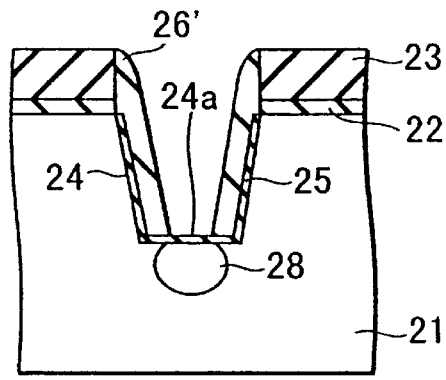

Next, as shown in FIG. 2C, for example, the silicon nitride film 26 is etched back by anisotropic etching. In this manner, the remaining portion of silicon nitride film 26' (to be called side wall hereinafter) is left selectively only on the lateral surface (inner wall) portion of the buried element isolation trench 24.

Further, boron ions are implanted to the above-described structure at an acceleration voltage of 20 keV and a concentration of about $1 \times 10^{13}$ cm$^{-2}$ in the case where the substrate (or well) 21 in the region where the buried element isolation trench 24 is formed is p-type. Or, for example, phosphor ions are implanted to the above-described structure at an acceleration voltage of 30 keV and a concentration of about $1 \times 10^{13}$ cm$^{-2}$ in the case where the substrate (or well) 21 in the region where the buried element isolation trench 24 is formed is n-type. Thus, in a region of the substrate (or well) 21, which corresponds to the bottom portion of the buried element isolation trench 24, a punch-through suppression region 28 having the same conductivity type as that of the substrate (or well) 21 of the region and having an impurity concentration higher than that of other substrate (or well) 21 located close thereto, is formed.

Consequently, in the case of the structure shown in FIG. 2C, the punch-through suppression region 28 made so as to control the punch-through between element isolation regions is formed in a portion of the bottom surface 24a of the buried element isolation trench 24, which is located on an inner side from the edge of the bottom surface 24a by a distance determined on the basis of the thickness of the film of the side wall 26'. It should be noted that in the above-described case, the thickness of the silicon nitride film is set to be larger than the distance which the impurities diffuse, by a thermal step carried out after the ion implantation.

Further, with regard to the structure shown in FIG. 2C, the insulating film 29 is flattened by a CMP method or a resist etch back, after the insulating film (filler member) 29 which is, for example, a silicon oxide film, is buried. Subsequently, the insulating film 29, the silicon nitride films 23 and 26, and the silicon oxide film 22 are removed except for what is inside the buried element isolation trench 24. Thus, as shown in FIG. 2D, a buried type element isolation structure 30, which is made of the insulating film 29 and the side wall 26', is completed. Next, as shown in, for example, FIG. 2E, a p-type well 32a is formed in the region in which the n-type transistor is formed, and similarly, an n-type well 32b is formed in the region in which the p-type transistor is formed. After that, ion implantation designed for the adjustment of the threshold value is carried out so that the transistor has desired electrical characteristics.

A gate oxide film 33 is formed on the semiconductor substrate 21, and a gate electrode 34 is formed on the gate oxide film 33.

Further, arsenic ions are implanted to the above-described structure at an acceleration voltage of 40 keV and a concentration of about $2 \times 10^{15}$ cm$^{-2}$ in the case where the substrate (or well) 1 in the region where the well of the region in which the gate electrode 34 is formed is p-type (that is, in the case of a p-type well 32a). Or, for example, BF$_2$ ions are implanted to the above-described n-type well 32b at an acceleration voltage of 30 keV and a concentration of about $3 \times 10^{15}$ cm$^{-2}$. In this manner, a high-concentration diffusion layer region 31 which give rise to a source or drain region of an MOSFET is formed.

Figure 2F:
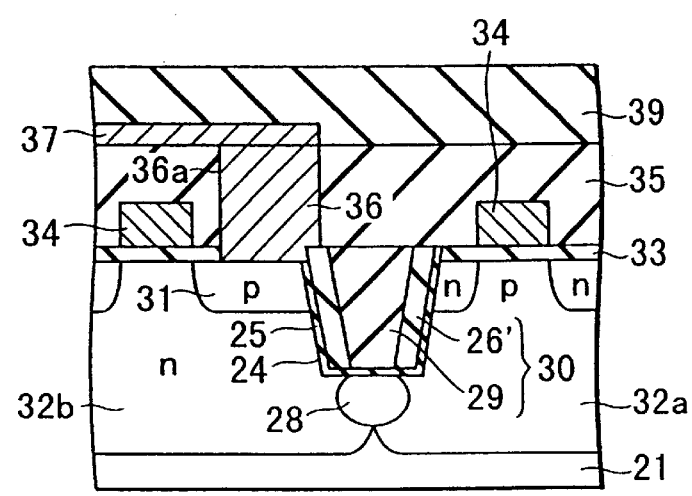

Next, as shown in FIG. 2F, an interlayer insulating film (first interlayer film) 35 made of, for example, silicon oxide film, is deposited on the entirety of the semiconductor substrate 21. Then, the interlayer insulating film 35 is selectively removed to form a contact hole 36a in the region designed for the electrical connection. Further, a conductive material is filled into the contact hole 36a, thus forming a contact 36 which is connected to the high-concentration diffusion layer region 31. Further, a first wiring 37 connected to the contact 36 is formed.

Figure 3:
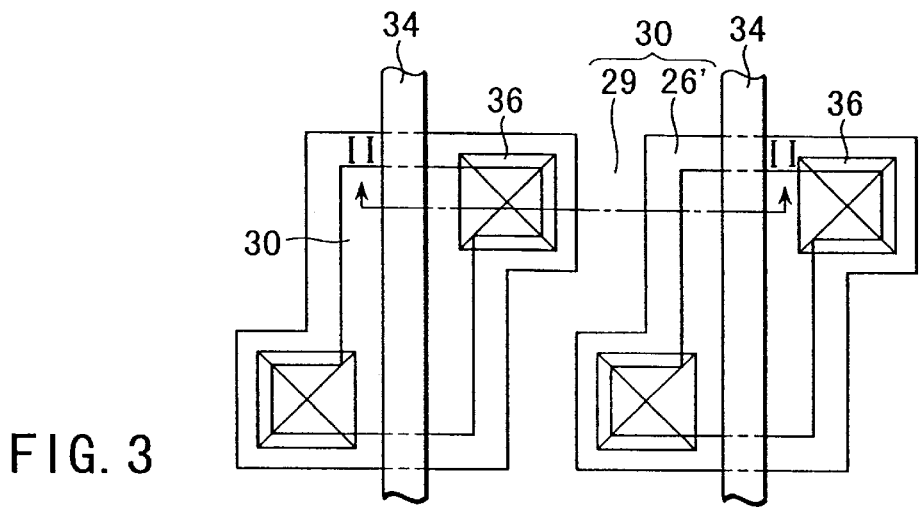
FIG. 3 is a plan view briefly showing the semiconductor device shown in FIGS. 2A to 2F.

If necessary, further interlayer insulating films (the second, third, . . . interlayer films) and an upper layer wiring (any of them are not shown), or the like are formed. Then, lastly, a protection film 39 such as a silicon nitride film is applied on the surface, and thus a semiconductor device having a plane structure shown in, for example, FIG. 3, is completed. Note that FIGS. 2A to 2F are cross sections taken along the line II—II of FIG. 3.

In the buried type element isolation structure 30 prepared by the above-described steps, the high-concentration diffusion layer region 31 and the punch-through suppression region 28 having a high concentration are formed without being contact with each other. Thus, in such a shallow and fine element isolation structure (so-called STI), the capacitance of the high-concentration diffusion layer region 31 can be set to a desired value which is determined by the concentration of the substrate 21 or well 32a or 32b, thus making it possible to improve the performance of the semiconductor device.

Further, the side wall 26' which is a part of the silicon nitride film 26 is present on the lateral surface of the element isolation trench 24. Therefore, even if the contact hole 36a is displaced by some production error, the occurrence of the junction leak, which is caused by the etching of the element isolation structure, can be prevented. Therefore, the margin from the contact hole 36a to the element isolation region (element isolation structure 30) can be shortened, and further it becomes possible to form a contact hole 36a in a self-alignment manner with respect to the element isolation region. This makes it possible to further downsize the devices.

Lastly, it should be noted that the first embodiment has been described in connection with an example where the silicon nitride film 26 is subjected to anisotropic etching as illustrated in FIG. 2C, after the step shown in FIG. 2B. However, the present invention is not limited to such a case, but it is possible that the step shown in FIG. 2B can be followed directly by the step shown in FIG. 2D without exposing the bottom surface 24a of the buried-type element isolation trench 24. In this case, the contact 36 to be connected to the high-concentration diffusion layer region 31 can be formed perfectly in a self-aligned manner with respect to the element isolation structure 30.

(Second Embodiment)

Figure 4:
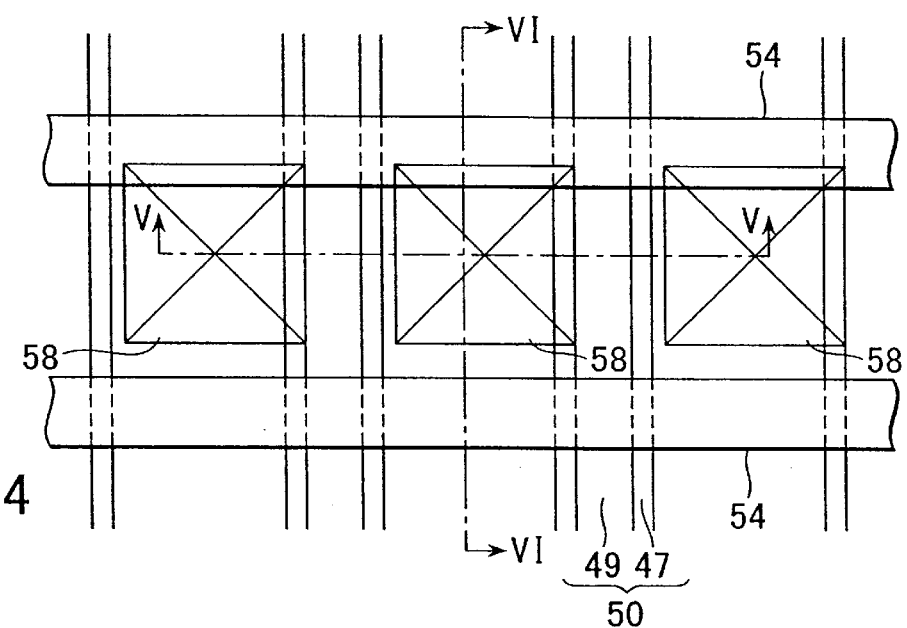
FIG. 4 is a plan view briefly showing a semiconductor device according to the second embodiment of the present invention, taking the example where the product is an SRAM (static random access memory)
Figure 6:
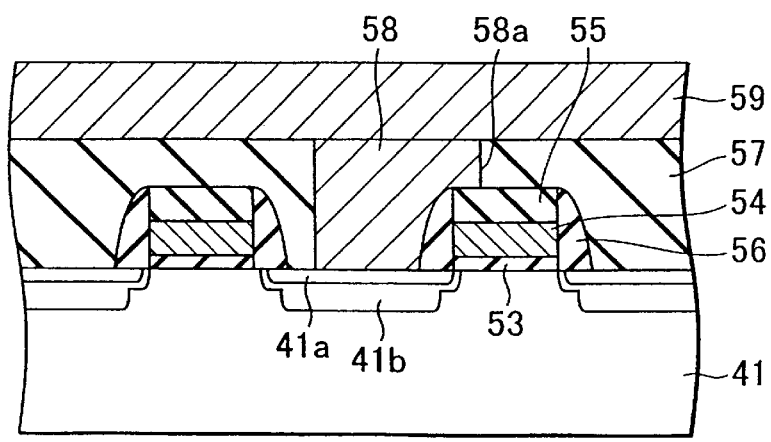
FIG. 6 is a cross section briefly showing the SRAM shown in FIG. 4, taken along the line VI—VI.

FIG. 4, FIGS. 5A to 5E and FIG. 6 briefly illustrate the semiconductor device according to the second embodiment of the present invention, taking the example where the product is an SRAM. FIG. 4 is a plan view showing the SRAM with a see-through image of the main portion thereof, FIGS. 5A to 5E are cross sectional views illustrating the steps of the manufacturing process of the SRAM, taken along the line V—V of FIG. 4, and FIG. 6 is a cross sectional view showing the structure of the SRAM taken along the line VI—VI of FIG. 6.

Figure 5A:
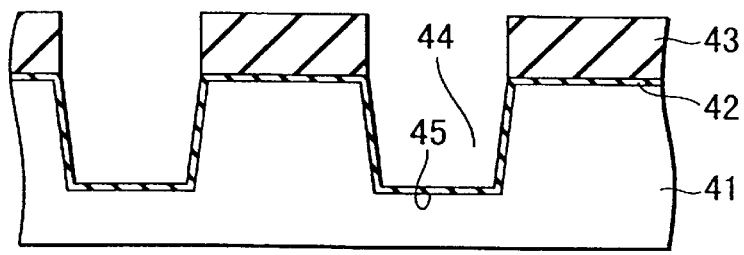
FIGS. 5A to 5E are cross sectional views illustrating steps of the manufacturing process for preparing the SRAM shown in FIG. 4.

First, as shown in FIG. 5A, a silicon oxide film 42 is formed to have a thickness of about 10 nm, on a semiconductor substrate 41 by a thermal oxidation method or the like. Then, a polycrystalline silicon film (mask film) 43 is deposited to have a thickness of about 200 nm, on the silicon oxide film 42 by a chemical vapor growth method or the like.

With respect to the above-described structure, the polycrystalline silicon film 43, the silicon oxide film 42 and the semiconductor substrate 41 are subjected to anisotropic etching one after another by a photo-etching method. Thus, a buried type element isolation trench 44 having a tapered shape with a predetermined angle, which is a trench used for isolating the buried type elements, is made. After that, heat oxidation is carried out, and consequently, a silicon oxide film 5 having a thickness of, for example, about 15 nm is formed on the inner wall of the buried element isolation trench 44.

Figure 5B:
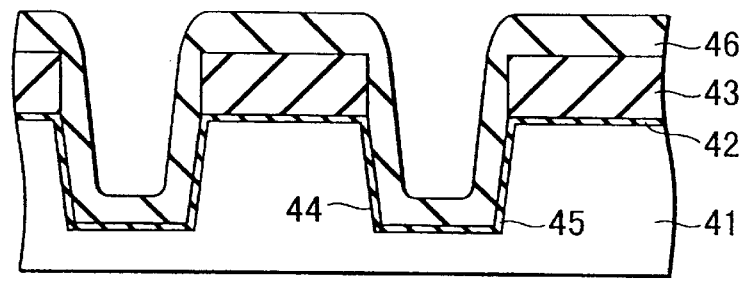

Next, with regard to the resultant structure shown in FIG. 5A, a silicon nitride film 46 is deposited to have a thickness of about 50 nm, on the silicon nitride film 43 and the silicon oxide film 45, by a chemical vapor growth method, as illustrated shown in FIG. 5B. The silicon nitride film 46 becomes to have an etching selection ratio with respect to the silicon oxide film 45 or an interlayer insulating film, when a contact hole is made in a later step, as in the case of the first embodiment.

Figure 5C:
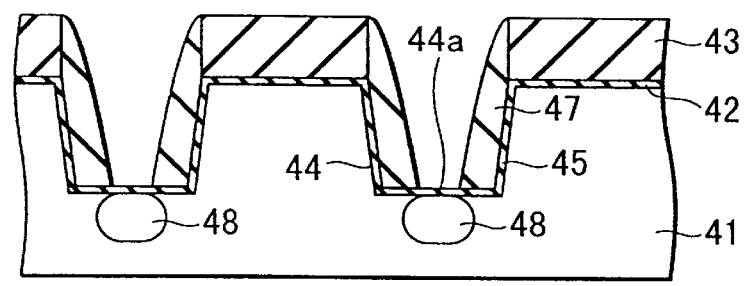

Next, as shown in FIG. 5C, for example, the silicon nitride film 46 is etched back by anisotropic etching. In this manner, the remaining portion of silicon nitride film 47 (to be called side wall hereinafter) is left selectively only on the lateral surface (inner wall) portion of the buried element isolation trench 44.

Further, boron ions are implanted to the above-described structure at an acceleration voltage of 20 keV and a concentration of about $1\times10^{13}$ cm$^{-2}$ in the case where the substrate (or well) 41 in the region where the buried element isolation trench 44 is formed is p-type. Or, for example, phosphor ions are implanted to the above-described structure at an acceleration voltage of 30 keV and a concentration of about $1\times10^{13}$ cm$^{-2}$ in the case where the substrate (or well) 41 in the region where the buried element isolation trench 44 is formed is n-type. Thus, in a region of the substrate (or well) 41, which corresponds to the bottom portion of the buried element isolation trench 44, a punch-through suppression region 48 having the same conductivity type as that of the substrate (or well) 41 of the region and having an impurity concentration higher than that of other substrate (or well) 41 located close thereto, is formed.

Consequently, in the case of the structure shown in FIG. 5C, the punch-through suppression region 48 made so as to control the punch-through between element isolation regions is formed in a portion of the bottom surface 44a of the buried element isolation trench 44, which is located on an inner side from the edge of the bottom surface 44a by a distance determined on the basis of the thickness of the film of the side wall 47. It should be noted that in the above-described case, the thickness of the silicon nitride film 46 which give rise to the side wall 47 is set to be larger than the distance which the impurities diffuse, by a thermal step carried out after the ion implantation.

Further, with regard to the structure shown in FIG. 5C, the insulating film 49 is flattened by a CMP method or a resist etch back, after the insulating film (filler member) 49 which is, for example, a silicon oxide film, is buried. Subsequently, the insulating film 49, the silicon nitride films 46, (side wall 47), the polycrystalline silicon film 43 and the silicon oxide film 42 are removed except for what is inside the buried element isolation trench 44. Thus, as shown in FIG. 5D, a buried type element isolation structure 50, which is made of the insulating film 49 and the side wall 47, is completed.

Figure 5D:
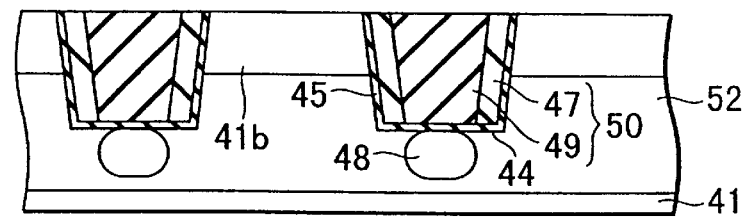

Next, as shown in FIG. 5D, for example, a p-type well 52 is formed in the region in which the n-type transistor is formed, and similarly, an n-type well (not shown) is formed in the region in which the p-type transistor is formed. After that, ion implantation designed for the adjustment of the threshold value is carried out so that the transistor has desired electrical characteristics.

After that, as shown in FIG. 6, for example, a laminate structure of a gate insulating film 53, a polysilicon layer (gate electrode) 54 and a silicon nitride film 55, is formed on the surface portion of the semiconductor substrate 41. Then, ion implantation and thermal processing are carried out, to form a first source-drain diffusion region (shallow diffusion layer) 41a on the surface of the semiconductor substrate. Subsequently, on both sides of the laminate structure made of the gate insulating film 53, the polysilicon layer 54 and the silicon nitride film 55, gate side wall 56 are formed. As further ion implantation is carried out, a second source-drain diffusion region (deep diffusion layer) 41b is formed.

Next, with respect to the structure as shown in FIG. 6, an interlayer insulating film (interlayer film) 57 made of, for example, silicon oxide film, is deposited on the entirety of the semiconductor substrate 41. Then, the interlayer insulating film 57 is selectively removed to form a contact hole 58a in the region designed for the electrical connection. Further, a conductive material is filled into the contact hole 58a, thus forming a contact 58 which is connected to the source-drain diffusion layer regions 41a and 41b. Further, a metal wiring layer 59 connected to the contact 58 is formed, and thus SRAMs having cross sectional structures shown in FIG. 5E and FIG. 6 are completed.

Figure 5E:
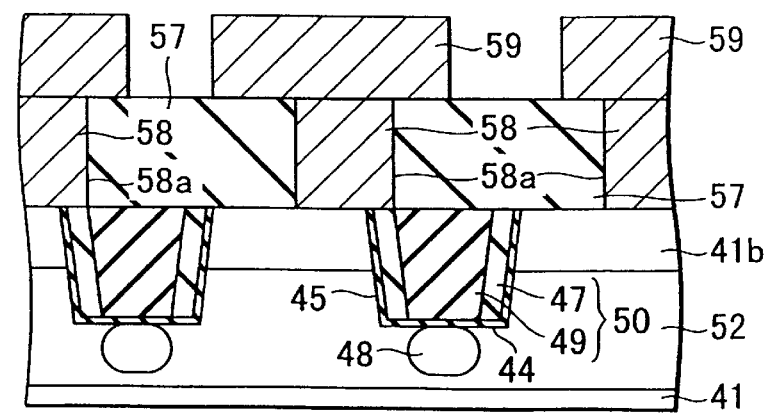

The structure shown in FIG. 5E is a cross section of the SRAM shown in FIG. 4, taken along the line V—V, and the structure shown in FIG. 6 is a cross section of the SRAM shown in FIG. 4, taken along the line VI—VI.

In the case where the allowance between the contact hole 58a and the element isolation structure 50 is small, the contact hole 58a extend to the element isolation structure 50 in some cases due to the alignment error of the mask during the photo-etching, as shown in FIG. 5E. Even in the above-described situation, the side wall 47 which is a part of the silicon nitride film 46 is present in the outer periphery of the element isolation structure 50 in the second embodiment of the present invention. Therefore, when an etching method which has a selectivity towards the nitrogen film is used to open the contact hole 58a, the element isolation structure 50 is not etched. Therefore, the occurrence of the junction leak can be prevented.

As an alternative version of the second embodiment, it is possible to form a punch-through suppression region 48 in the step shown in FIG. 5B, rather than in the step shown in FIG. 5C. In this version, boron ions are implanted to the above-described structure at an acceleration voltage of 40 keV and a concentration of about $1\times10^3$ cm$^{-2}$ in the case where the substrate (or well) 41 in the region where the buried element isolation trench 44 is formed is p-type. Or, for example, phosphor ions are implanted to the above-described structure at an acceleration voltage of 60 keV and a concentration of about $1\times10^3$ cm$^{-2}$ in the case where the substrate (or well) 41 in the region where the buried element isolation trench 44 is formed is n-type. Thus, a punch-through suppression region 48 can be easily formed without exposing the bottom surface 44a, by increasing the acceleration energy at the ion implantation by an amount which corresponds to the thickness of the silicon nitride film 46 deposited on the bottom portion of the buried element isolation trench 44.

(Third Embodiment)

FIGS. 7A to 7D briefly illustrate the process of manufacturing a semiconductor device, according to the third embodiment of the present invention.

Figure 7A:
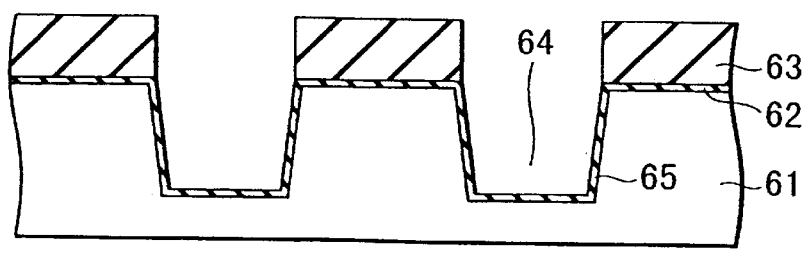
FIGS. 7A to 7D are cross sectional views illustrating steps of the manufacturing process for preparing a semiconductor device, according to the third embodiment of the present invention.

First, for example, as shown in FIG. 7A, a silicon oxide film 62 is formed to have a thickness of about 10 nm, on a semiconductor substrate 61 by a thermal oxidation method or the like. Then, a silicon nitride film (mask film) 63 is deposited to have a thickness of about 200 nm, on the silicon oxide film 62 by a chemical vapor growth method or the like.

With respect to the above-described structure, the silicon nitride film 53, the silicon oxide film 62 and the semiconductor substrate 61 are subjected to anisotropic etching one after another by a photo-etching method. Thus, a buried type element isolation trench 64 having a tapered shape with a predetermined angle, which is a trench used for isolating the buried type elements, is made. After that, heat oxidation is carried out, and consequently, a silicon oxide film 65 having a thickness of, for example, about 15 nm is formed on the inner wall of the buried element isolation trench 64.

Figure 7B:
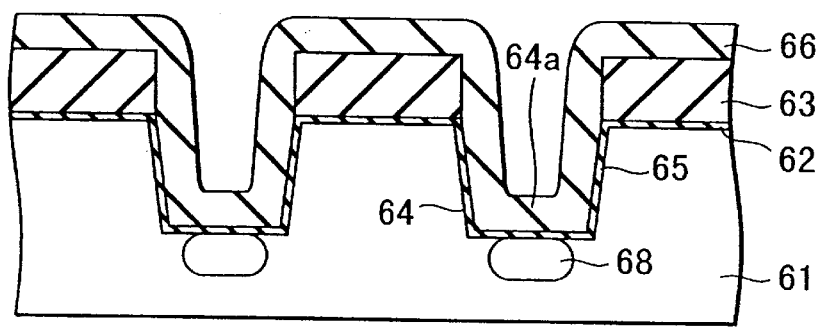

Next, with regard to the resultant structure shown in FIG. 7A, a silicon nitride film 66 is deposited to have a thickness of about 50 nm, on the silicon nitride film 63 and the silicon oxide film 65, by a chemical vapor growth method, as illustrated shown in FIG. 7B. The silicon nitride film 66 becomes to have an etching selection ratio with respect to the silicon oxide film 65 or an interlayer insulating film, when a contact hole is made in a later step, as in the case of the first or second embodiment.

Further, with respect to this structure, boron ions are implanted to the above-described structure at an acceleration voltage of 40 keV and a concentration of about $1\times10^{13}$ cm$^{-2}$ in the case where the substrate (or well) 61 in the region where the buried element isolation trench 64 is formed is p-type. Or, for example, phosphor ions are implanted to the above-described structure at an acceleration voltage of 60 keV and a concentration of $1\times10^{13}$ cm$^{-2}$ in the case where the substrate (or well) 61 in the region where the buried element isolation trench 64 is formed is n-type. Thus, in a region of the substrate (or well) 61, which corresponds to the bottom portion of the buried element isolation trench 64, a punch-through suppression region 68 having the same conductivity type as that of the substrate (or well) 61 of the region and having an impurity concentration higher than that of other substrate (or well) 61 located close thereto, is formed.

Consequently, in the case of the structure shown in FIG. 7B, the punch-through suppression region 48 made so as to control the punch-through between element isolation regions is formed in a portion of the bottom surface 64a of the buried element isolation trench 64, which is located on an inner side from the edge of the bottom surface 64a by a distance determined on the basis of the thickness of the silicon nitride film 66 formed on the inner wall of the element isolation trench 64.

Further, with regard to the structure shown in FIG. 7B, the insulating film 69 is flattened by a CMP method or a resist etch back, after the insulating film (filler member) 69 which is, for example, a silicon oxide film, is buried. Subsequently, the insulating film 69, the silicon nitride films 63 and 66, the silicon oxide film 62 are removed except for what is inside the buried element isolation trench 64. Thus, as shown in FIG. 7C, a buried type element isolation structure 70, which is made of the insulating film 69 and the silicon nitride film 66, is completed.

Figure 7C:
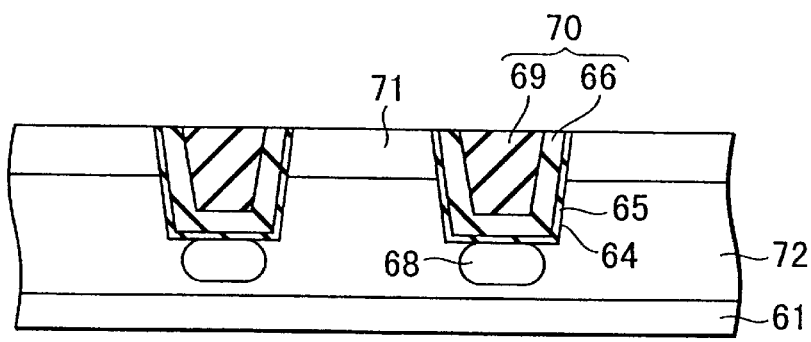

Next, as shown in FIG. 7C, for example, a p-type well 72 is formed in the region in which the n-type transistor is formed, and similarly, an n-type well (not shown) is formed in the region in which the p-type transistor is formed. After that, ion implantation designed for the adjustment of the threshold value is carried out so that the transistor has desired electrical characteristics.

Next, as in the second embodiment, an interlayer insulating film 73 made of, for example, silicon oxide film, is deposited on the entirety of the semiconductor substrate 61 after the formation of the gate (not shown) of the MOS transistor and the diffusion layer region 71. Then, the interlayer insulating film 73 is selectively removed to form a contact hole 74a in the region designed for the electrical connection. Further, a conductive material is filled into the contact hole 74a, thus forming a contact 74 which is connected to the diffusion layer region 71. Thus, a semiconductor device having a cross sectional structure such as shown in FIG. 7D is completed.

Figure 7D:
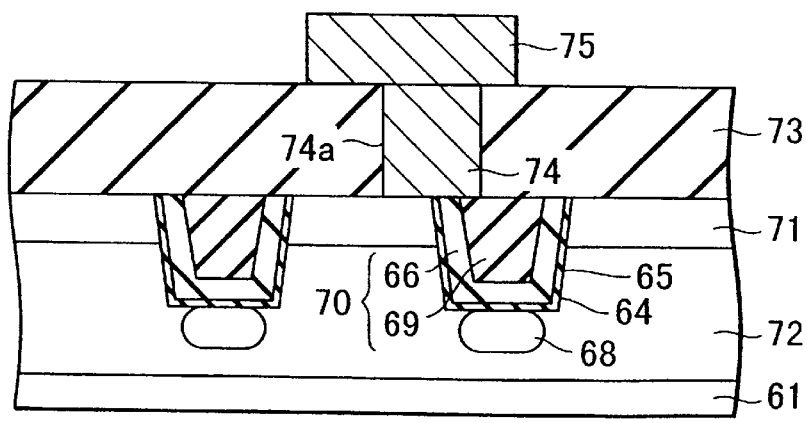

In this embodiment, if the allowance between the contact hole 74a and the element isolation structure 70 is small, the contact hole 74a extend to the element isolation structure 70 in some cases due to the alignment error of the mask during the photo-etching, as shown in FIG. 7D. Even in the above-described situation, the silicon nitride film 66 is present in the outer periphery of the element isolation structure 50 in the third embodiment of the present invention. Therefore, when an etching method which has a selectivity towards the nitrogen film is used to open the contact hole 74a, the element isolation structure 70 is not etched. Therefore, the occurrence of the junction leak can be prevented.

It should be noted that in the third embodiment, the buried element isolation trench is made into a tapered shape, and the angle of the taper is set in consideration of the allowance for case where the contact hole 74a is formed to be displaced on the element isolation structure 70. Further, with the tapered shape of the buried element isolation trench 64, it becomes easy to set the thickness of the silicon nitride film 66 formed on the inner wall of the element isolation trench 64 to a desired value. However, the adjustment, that is, an increase or decrease, of the taper angle is determined by the limitation of the fine process, and a preferable angle is about 60° to 85°.

Further, in any of the first to third embodiments, it is not necessary to form all the contacts to extend over the diffusion layer region and the buried element isolation structure. In other words, it suffices only if at least one contact is formed to extend over the diffusion layer region and the buried element isolation structure.

Apart from the above, it is natural that the preset invention can be remodeled into various versions of embodiments as long as the essence of the invention remains.

As described above in detail, with the present invention, it becomes possible to form a buried element isolation structure without bringing the high-concentration diffusion layer and a relatively high concentration region made for the purpose of the punch-through suppression in contact with each other. Therefore, a semiconductor device, even if it has a shallow or fine element isolation structure, can be made capable of a high performance, and preventing the occurrence of a junction leak between the high-concentration diffusion layer region and the well. Thus, the present invention can provide a semiconductor device having a buried type element isolation structure, capable of high performance, and a method of manufacturing such a semiconductor device.

Moreover, the capacitance of the high-concentration diffusion layer region can be set to a desired value which is determined by the concentration of the well, thus making it possible to improve the performance of the semiconductor device. Further, the silicon nitride film is present on the lateral surface of the element isolation trench. Therefore, even if the contact hole is displaced by some production error, the occurrence of the junction leak, which is caused by the etching of the element isolation structure, can be prevented. Therefore, the margin from the contact hole to the element isolation region can be shortened, and further it becomes possible to form a contact hole in a self-alignment manner with respect to the element isolation region. This makes it possible to further downsize the products.

Additional advantages and modifications will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

What is claimed is:

1. A method of manufacturing a semiconductor device having a buried-type element isolation structure, comprising:

forming a buried-type element isolation trench in a semiconductor substrate of a first conductivity type;

forming a first insulating film on an inner surface of the buried-type element isolation trench;

forming a second insulating film having an etching selectivity ratio to an interlayer film on a side wall portion of said first insulating film formed on the inner surface of the buried-type element isolation trench;

introducing impurities through said first insulating film to a bottom portion of the buried-type element isolation trench to form a high-concentration impurity region of the first conductivity type under the bottom portion of the buried-type element isolation trench in said semiconductor substrate so that the high-concentration impurity region contacts to the first insulating film at the bottom portion of said buried-type element isolation trench with a distance determined by a thickness of the first insulating film; and burying an insulation material in said buried-type element isolation trench to form a buried-type element isolation structure in said buried-type element isolation trench together with the second insulating film;

forming a diffusion region of a second conductivity type in a surface portion of the semiconductor substrate except for a region where said buried-type element isolation trench is formed;

depositing said interlayer insulation film on a whole surface of said semiconductor substrate; and forming a contact section through the interlayer insulation film so that the contact section is connected to the diffusion layer and is formed to extend over the diffusion layer and the buried-type element isolation structure.

2. A method of manufacturing a semiconductor device according to claim 1, further comprising:

performing a thermal process for thermally diffusing the introduced impurities to an extent equal or small than the thickness of the first insulating film.

3. A method of manufacturing a semiconductor device, according to claim 1, wherein said second insulating film forming comprises:

depositing an insulation layer on a whole inner wall portions including the side wall portion and a bottom wall portion; and performing anisotropic etching the insulation layer so that the insulation layer deposited on the bottom wall portion is removed and the second insulating film is partially left on only the side wall portion of the first insulating film formed on the buried-type element isolation trench.

4. A method of manufacturing a semiconductor device, according to claim 3, wherein said insulation layer is formed by depositing a silicon nitride film on the first insulating film formed on the inner wall of the buried-type element isolation trench.

5. A method of manufacturing a semiconductor device, comprising:

forming an oxide film on a semiconductor substrate of a first conductivity type;

forming a mask on said oxide film to form a buried-type element isolation trench in said semiconductor substrate;

forming said buried-type element isolation trench in said semiconductor substrate by performing anisotropic etching the oxide film and the semiconductor substrate using said mask;

forming an insulating film along an inner surface of the buried-type element isolation trench;

forming a high-concentration impurity region of the first conductivity type at a region beneath the insulating film formed at a bottom surface of the buried-type element isolation trench;

forming a buried-type element isolation structure by burying a filler insulation member in the buried-type element isolation trench;

forming a diffusion layer of a second conductivity type in a surface region of said semiconductor substrate except for a region where said buried-type element isolation structure is formed;

depositing an interlayer film having an etching selectivity ratio to the insulating film on an entire surface of said semiconductor substrate; and forming a contact section pierced through the interlayer film to be connected to the diffusion layer in a self-alignment manner with respect to the buried-type element isolation structure.

6. A method of manufacturing a semiconductor device according to claim 3, wherein said contact section is formed to extend over said diffusion layer and said buried-type element isolation structure.

7. A method of manufacturing a semiconductor device according to claim 5, wherein said buried-type element isolation trench is formed to have a predetermined taper angle with respect to a surface of said semiconductor substrate.

8. A method of manufacturing a semiconductor device according to claim 5, further comprising:

performing a thermal process for thermally diffusing the high-concentration impurity region to an extent equal or small than the thickness of the insulating film.

9. A method of manufacturing a semiconductor device according to claim 5, which further comprises:

depositing an insulation layer on a whole inner surface of the insulating film formed on the buried-type element isolation trench;

etching selectively a portion of the insulation layer formed on a bottom portion of the buried-type element isolation trench so as to remain a side wall insulation layer on a side wall of the inner surface of the insulating film.

10. A method of manufacturing a semiconductor device according to claim 9, wherein said high-concentration impurity region is formed while said insulation layer is selectively left on only the side wall portion of the buried-type element isolation trench via the insulating film.

11. A method of manufacturing a semiconductor device according to claim 9, wherein a silicon nitride film is deposited as said insulation layer.

* * * * *